(12) United States Patent
Lin et al.

(10) Patent No.: US 8,669,640 B2
(45) Date of Patent: Mar. 11, 2014

(54) BIPOLAR TRANSISTOR

(75) Inventors: Xin Lin, Phoenix, AZ (US); Daniel J. Blomberg, Chandler, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 248 days.

(21) Appl. No.: 12/502,812

(22) Filed: Jul. 14, 2009

(65) Prior Publication Data
US 2011/0012232 A1 Jan. 20, 2011

(51) Int. Cl.
*H01L 29/735* (2006.01)
*H01L 21/331* (2006.01)

(52) U.S. Cl.
USPC .... 257/586; 257/565; 257/592; 257/E21.373; 257/E29.187; 257/593; 438/370; 438/335

(58) Field of Classification Search
USPC .................................................. 257/565–593
See application file for complete search history.

(56) References Cited

U.S. PATENT DOCUMENTS

| | | | | |
|---|---|---|---|---|
| 4,214,315 A * | 7/1980 | Anantha et al. | ................ | 257/517 |
| 4,390,890 A * | 6/1983 | Bergeron et al. | ............. | 257/573 |
| 4,599,635 A * | 7/1986 | Itoh et al. | ....................... | 257/574 |
| 4,939,566 A * | 7/1990 | Singer et al. | .................... | 257/343 |
| 4,963,970 A * | 10/1990 | Throngnumchai et al. | ... | 257/335 |
| 5,073,810 A * | 12/1991 | Owada et al. | ................... | 257/588 |
| 5,374,843 A * | 12/1994 | Williams et al. | .............. | 257/492 |
| 5,587,599 A | 12/1996 | Mahnkopf et al. | | |
| 5,675,175 A * | 10/1997 | Iranmanesh | ................... | 257/565 |
| 5,796,146 A * | 8/1998 | Ludikhuize | ................... | 257/343 |
| 5,883,413 A * | 3/1999 | Ludikhuize | ................... | 257/343 |
| 6,020,636 A * | 2/2000 | Adishian | ........................ | 257/728 |
| 6,392,282 B1* | 5/2002 | Sahara et al. | .................. | 257/438 |
| 7,671,447 B2* | 3/2010 | Montree et al. | ............... | 257/565 |
| 2003/0127707 A1* | 7/2003 | Matsushita et al. | ........... | 257/573 |
| 2008/0083968 A1* | 4/2008 | Montree et al. | ............... | 257/591 |

OTHER PUBLICATIONS

Tang, et. al. Hybrid All-SiC MOS-Gated Bipolar Transistor, IEEE 2002, Proceeding of the 14th International Symposium on Power Semiconductor Devices and ICs, pp. 53.*
Zhao, et. al. 1570V, 14A 4H-SiC Bipolar Darlington with a High Current Gain of beta>462, 2003, www.scientific.net/MSF.457- 460. 1169.pdf.*

(Continued)

*Primary Examiner* — Lex Malsawma
*Assistant Examiner* — Sheng Zhu
(74) *Attorney, Agent, or Firm* — Sherry W. Schumm

(57) ABSTRACT

An improved device (20) is provided, comprising, merged vertical (251) and lateral transistors (252), comprising thin collector regions (34) of a first conductivity type sandwiched between upper (362) and lower (30) base regions of opposite conductivity type that are Ohmically coupled via intermediate regions (32, 361) of the same conductivity type and to the base contact (38). The emitter (40) is provided in the upper base region (362) and the collector contact (42) is provided in outlying sinker regions (28) extending to the thin collector regions (34) and an underlying buried layer (28). As the collector voltage increases part of the thin collector regions (34) become depleted of carriers from the top by the upper (362) and from the bottom by the lower (30) base regions. This clamps the thin collector regions' (34) voltage well below the breakdown voltage of the PN junction formed between the buried layer (28) and the lower base region (30). The gain and Early Voltage are increased and decoupled and a higher breakdown voltage is obtained.

20 Claims, 7 Drawing Sheets

(56) References Cited

OTHER PUBLICATIONS

Ouyang, Q.C. et. al., "A simulation study on thin SOI bipolar transistors with fully or partially depleted collector", Proc. BCTM 2002, pp. 28-31.

Arnborg, T., et al., "Analysis of new high-voltage bipolar Silicon-On-Insulator transistor with fully depleted collector", IEEE Trans. Electron Dev., vol. 42, issue 1, Jan. 1995, pp. 172-177.

* cited by examiner

BIPOLAR TRANSISTOR

FIELD OF THE INVENTION

The present invention generally relates to electronic devices and integrated circuits (ICs) and their methods of manufacture, and more particularly, structures and methods for forming bipolar transistors.

BACKGROUND OF THE INVENTION

Bipolar transistors are much used in modern electronic devices, especially integrated circuits (ICs). However, their performance is sometimes less than ideal, especially when they are being manufactured using a process optimized for other types of devices that may be the principal devices in the IC of which the bipolar transistor is to be a part. Metal-oxide-semiconductor field effect transistors (MOSFETS) are non-limiting examples of such other devices often widely used in ICs, but the present invention is not limited merely to ICs made primarily using MOSFET devices and applies to other manufacturing methods and device structures as well. The term MOSFET is intended to be interpreted broadly and include any type of dielectric (not just "oxide") and any type of conductor (not just "metal"). As used herein, the term "other device types" is intended to include any device types and not be limited merely to MOSFETS. Where bipolar transistors need to be included in the IC, they are typically made using whatever process steps are available for making the other device types that form the principal devices in the IC. Thus, the properties of the bipolar transistors that can be fabricated using such other device type manufacturing processes are often less than ideal and a need continues to exist for providing improved device properties without significantly modifying the underlying IC manufacturing process.

BRIEF DESCRIPTION OF THE DRAWINGS

The present invention will hereinafter be described in conjunction with the following drawing figures, wherein like numerals denote like or analogous elements, and wherein.

DETAILED DESCRIPTION OF THE INVENTION

Figure 1:
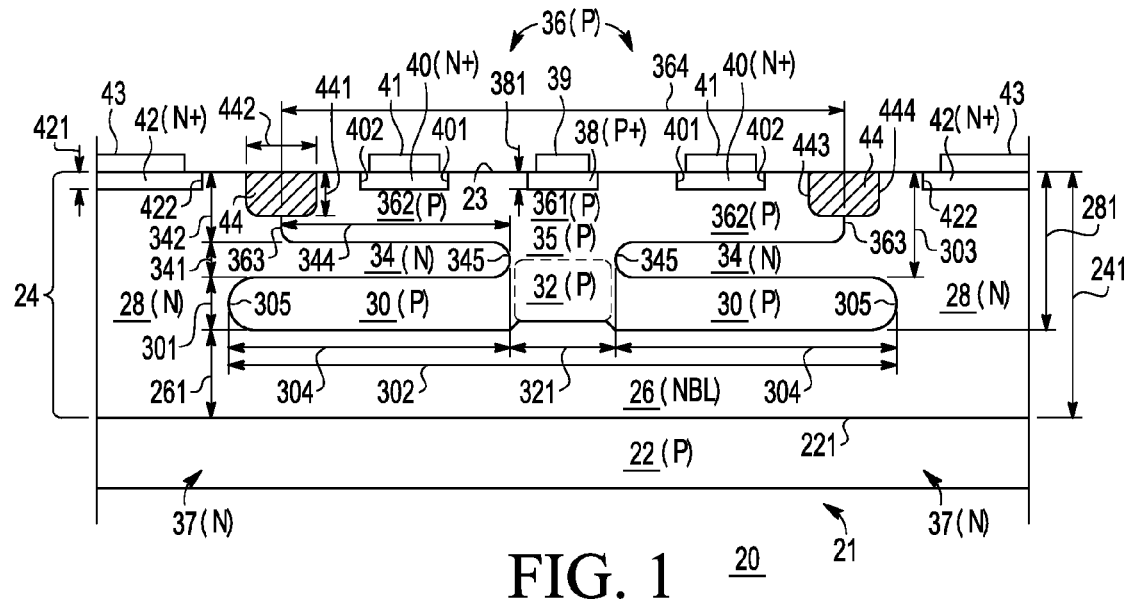
FIG. 1 is a simplified cross-sectional view of a bipolar transistor, according to an embodiment of the present invention.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions or layers in the figures may be exaggerated relative to other elements or regions or layers to help improve understanding of embodiments of the invention.

The terms "first," "second," "third," "fourth" and the like in the description and the claims, if any, may be used for distinguishing among similar elements and not necessarily for describing a particular sequential or chronological order. It is to be understood that the terms so used are interchangeable under appropriate circumstances such that the embodiments of the invention described herein are, for example, capable of operation or fabrication in sequences other than those illustrated or otherwise described herein. Furthermore, the terms "comprise," "include," "have" and variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled" as used herein, is defined as directly or indirectly connected in an electrical or non-electrical manner.

As used herein, the term "semiconductor" is intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline and amorphous structures, thin film structures, layered structures as for example and not intended to be limiting, semiconductor-on-insulator (SOI) structures, and combinations thereof. The term "semiconductor" is abbreviated as "SC." For convenience of explanation and not intended to be limiting, semiconductor devices and methods of fabrication may be described herein for silicon semiconductors but persons of skill in the art will understand that other semiconductor materials can also be used.

Figure 2:
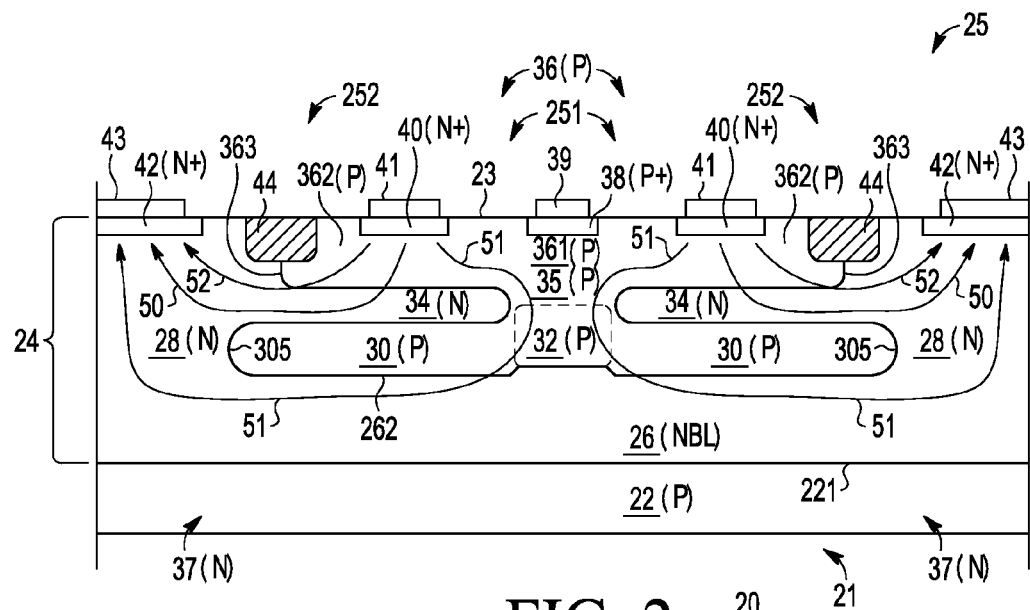
FIG. 2 is a simplified cross-sectional view of the device of FIG. 1 showing additional details.
Figure 3:
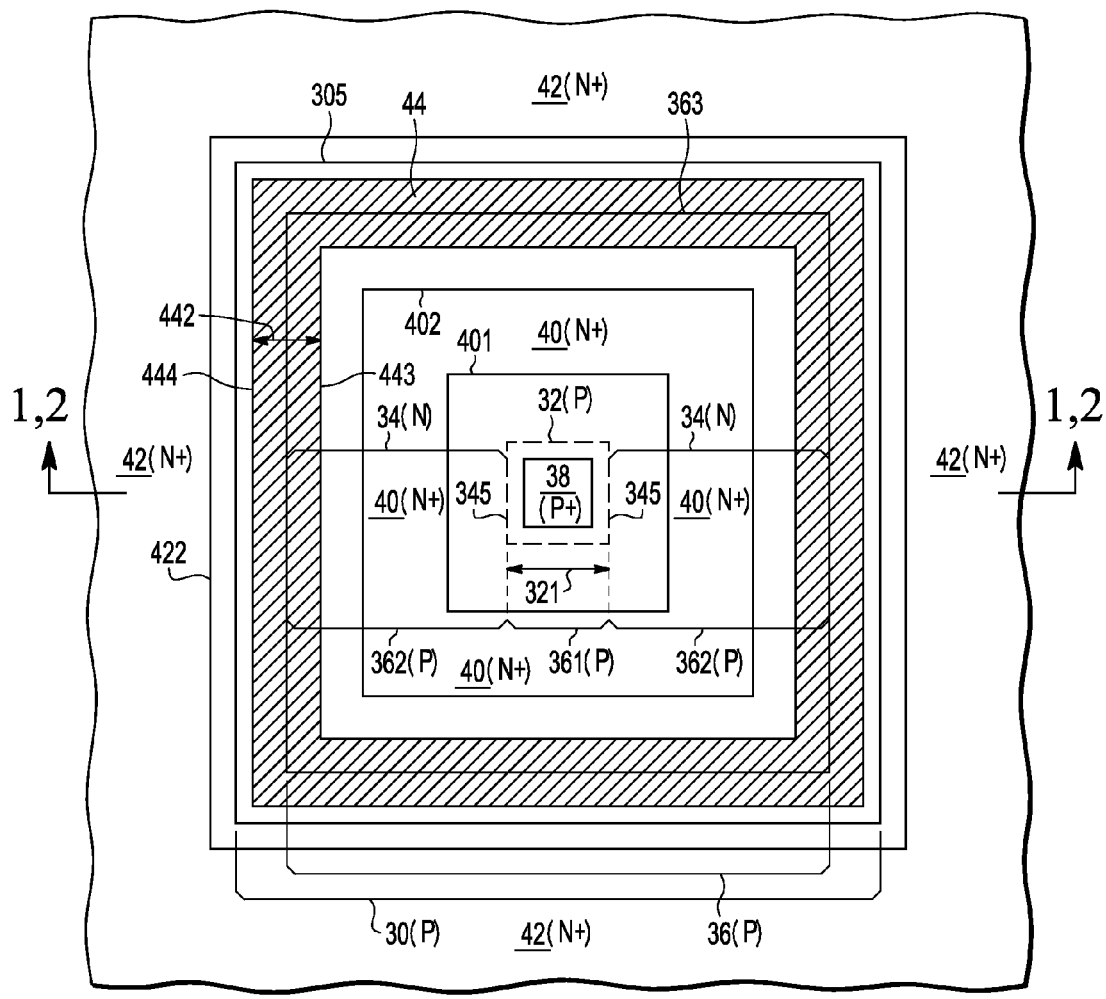
FIG. 3 is a simplified plan view of the device of FIG. 1.

FIGS. 1-2 are simplified cross-sectional views of bipolar transistor 20, according to an embodiment of the invention and FIG. 3 is a simplified plan view of device 20 of FIGS. 1-2, wherein FIGS. 1-3 are intended to illustrate the arrangement and relationship of various internal elements of device 20. FIGS. 1-3 are discussed together. Device 20 comprises substrate 21 having upper surface 23. Substrate 21 may comprise any of the semiconductor materials and forms described above. For convenience of illustration, it is presumed hereafter to be a silicon substrate, but this is not intended to be limiting and any semiconductor (SC) material in any configuration (e.g., monolithic, layered, polycrystalline, SOI, etc., as noted above) may be used.

Device 20 is further illustrated as comprising various N and P layers or regions, for example, 22(P), 26(NBL), 28(N), 30(P), 32(P), 34(N), 35(P), 36(P), 37(N), 38(P+), 40(N+), 42(N+) and so forth, and the parenthetic designations as (N) or (P) type conductivity are merely for convenience of explanation and by way of illustration of various embodiments and not intended to be limiting. Persons of skill in the art will understand that devices of opposite conductivity type are constructed by interchanging the doping types of the various exemplary N and P regions and that such regions may be more broadly referred to as being of a first conductivity type (which may be either N or P) or being of a second, opposite, conductivity type which is then either P or N. Device 20 may be substantially laterally surrounded by a dielectric isolation region, but this may be omitted in other embodiments, and is not shown in the drawings. Various surface dielectric layers that are customarily provided for surface passivation, implant screening or interlayer insulation or isolation are omitted in FIGS. 1-3 and other figures to avoid cluttering the drawings and obscuring the invention. The lateral edges of various regions are identified in both FIGS. 1 and 3 to facilitate relating the cross-sectional view of FIG. 1 and the plan view of FIG. 3. For example, outer lateral edges 305 of regions 30(P), outer lateral edges 363 of region 36(P), inner and outer lateral edges 401, 402 of regions 40(N+), inner lateral edges 422 of regions 42(N+) and inner and outer lateral edges 443, 444 of regions 44 are identified in both FIGS. 1 and 3. By comparing the cross-sectional views of FIGS. 1-2 and the plan view of FIG. 3, it will be apparent that many regions (e.g., regions 30(P), 34(N), 362(P), 44, 38(P+), 40(N+), 42(N+), etc., can have an annular plan view shape. This is not intended to be limiting, but merely to illustrate a preferred embodiment. Under these circumstances, such regions may appear in the cross-sectional views as multiple separated regions, when they can form a single connected region in plan view. For convenience of description, the plural form (e.g., regions, portions, etc.) is used in reference to such regions or portions even though they may be part of a single connected region. This is merely for convenience of description and not intended to be limiting.

Referring now to FIGS. 1-3, substrate 21 of device 20 is illustrated as comprising substrate region 22 (e.g., P type) surmounted by further doped region 24 of thickness 241 extending to surface 23. Thickness 241 is usefully in the range of about 0.4 to 10 micrometers, more conveniently about 0.6 to 6 micrometers, and preferably about 1 to 3 micrometers, but larger or smaller values may also be used. Substrate region 22 may be either N or P type, but in the exemplary embodiments illustrated herein, P type is preferred (hence the designation 22(P) in FIGS. 1-2 and 4-10), with a doping density in the range of about 1E14 to 1E18 atoms cm$^{-3}$, more conveniently in the range of about 5E14 to 1E17 atoms cm$^{-3}$, and preferably about 1E15 to 1E16 atoms cm$^{-3}$, but larger or smaller values may also be used. Further doped region 24 may include buried layer (BL) 26 of thickness 261. In the exemplary embodiments where layer 26 is conveniently N type, it is identified as layer 26(NBL) but this is merely for convenience of explanation and not intended to be limiting. Layer 26(NBL) overlies interface 221 with substrate region 22 and usefully has a doping level in the range of about 1E16 to 5E19 atoms cm$^{-3}$, more conveniently in the range of about 1E17 to 1E19 atoms cm$^{-3}$, and preferably about 5E17 to 5E18 atoms cm$^{-3}$, but larger or smaller values may also be used. Layer 26(NBL) serves substantially as part of the collector of device 20. Doped sinker regions 28(N) are provided at the left and right sides of FIGS. 1-2, extending from contact regions 42(N+) of depth 421 at surface 23 to make Ohmic contact with layer 26(NBL) at depth 281 below surface 23. The doping of sinker regions 28(N) should be sufficient so as to not introduce excessive resistance in the collector current path of device 20. Doping densities generally in the range of about 1E16 to 5E19 atoms cm$^{-3}$ are useful, more conveniently in the range of about 1E17 to 1E19 atoms cm$^{-3}$, and preferably about 5E17 to 5E18 atoms cm$^{-3}$, but larger or smaller values may also be used. Contact regions 42(N+) and associated conductive electrodes 43 serve as the collector terminals of device 20. Contact regions 42(N+) shown in FIGS. 1-3 and associated electrodes 43 shown in FIGS. 1-2 desirably have an annular shape, or electrode 43 can acts as a coupling electrode so that regions 42(N+) at the right and left sides of FIGS. 1-2 may be separate but are Ohmically coupled. Either arrangement is useful. While FIG. 3 depicts device 20 as having a substantially square plan-view shape, which is preferred, this is not intended to be limiting, and persons of skill in the art will understand that device 20 may have any plan view shape (e.g., rectangular, circular, elliptical, trapezoidal, polygonal, etc.) having a cross-section corresponding substantially to that of FIGS. 1-2.

Regions 30(P) of thickness 301 and overall lateral width 302 (including central portion 32(P)) between ends 305 is provided substantially centrally located between sinker regions 28(N) at depth 303 below surface 23. Regions 30(P) along with central portion 32(P) are also referred to as a "lower base" or lower portions of the base region of device 20. However, there is normally no significant electric current flowing though regions 30(P). This will be explained more fully later. Regions 30(P) help deplete overlying regions 34(N) as the base-collector junction of device 20 is reverse biased. Regions 30(P) make Ohmic contact to (upper) base region 36(P) via central portion 32(P) and are biased with the base potential. Regions 30(P) have thickness 301 usefully in the range of about 0.2 to 3.0 micrometers, more conveniently about 0.3 to 2.0 micrometers, and preferably about 0.5 to 1.0 micrometers, but larger or smaller values may also be used. Regions 30(P) have overall lateral width 302 usefully in the range of about 1 to 100 micrometers, more conveniently about 2 to 70 micrometers, and preferably about 3 to 40 micrometers, but larger or smaller values may also be used. Depth 303 is usefully in the range of about 0.2 to 5.0 micrometers, more conveniently about 0.3 to 4.0 micrometers, and preferably about 0.4 to 3.0 micrometers, but larger or smaller values may also be used. Regions 30(P) have a doping level usefully in the range of about 1E16 to 1E19 atoms cm$^{-3}$, more conveniently in the range of about 5E16 to 1E18 atoms cm$^{-3}$, and preferably about 1E17 to 5E17 atoms cm$^{-3}$, but larger or smaller values may also be used. Persons of skill in the art will understand that lateral extent 302, which corresponds to combined widths 304 and 321 (see FIG. 1), will depend upon the desired current handling capability of device 20, and that the dimensions given herein are merely to illustrate an exemplary device and not imply any particular limitation thereon. Regions 30(P) have central portion 32(P) of width 321, spaced at distances 304 from ends 305. Portion 32(P) usefully has a doping level usefully in the range of about 1E14 to 1E19 atoms cm$^{-3}$, more conveniently in the range of about 5E14 to 1E18 atoms cm$^{-3}$, and preferably about 1E15 to 1E16 atoms cm$^{-3}$, but larger or smaller values may also be used. Width 321 is usefully in the range of about 0.3 to 15 micrometers, more conveniently about 0.4 to 10 micrometers, and preferably about 0.5 to 5 micrometers, but larger or smaller values may also be used.

Finger regions 34(N) of thickness 341 overlie peripheral widths 304 of regions 30(P) and have peripheral widths 344 underlying portions 362(P) of region 36(P) at depth 342 beneath surface 23 of device 20. Finger regions 34(N) extend inward substantially from sinker regions 28(N) to inner periphery or edges 345 adjacent central portion 32(P) of width 321. In FIG. 3, finger regions 34(N) are shown as comprising a single region having a substantially rectangular washer-like annular plan-view shape, that is, a rectangular outer plan-view shape with a rectangular central hole of width 321 between inner perimeter edges 345. However, this is merely by way of example of a preferred embodiment and finger regions 34(N) may have a spoke-like plan-view shape of multiple inward-extending fingers, or may have a circular, oval, polygonal, etc., annular plan view shape as well as a rectangular washer-like annular plan view shape, and the term "finger regions" as used herein to refer to regions 34(N) is intended to include such variations and singular is intended to include the plural and vice versa. No matter whether multiple fingers or a washer-shaped arrangement is used for finger regions 34(N), it is important as will be explained later, that at least some parts of finger regions 34(N) can be substantially fully depleted of free carriers during operation of device 20. Finger regions 34(N) have thickness 341 usefully in the range of about 0.1 to 3.0 micrometers, more conveniently about 0.15 to 1.5 micrometers, and preferably about 0.2 to 1.0 micrometers, but larger or smaller values may also be used. Finger regions 34(N) have a lateral extent determined substantially by the lateral extent of underlying regions 30(P) and overlying regions 362(P). Depth 342 of finger regions 34(N) from surface 23 is usefully in the range of about 0.2 to 5.0 micrometers, more conveniently about 0.25 to 4.0 micrometers, and preferably about 0.3 to 3.0 micrometers, but larger or smaller values may also be used. Finger regions 34(N) have a doping level usefully in the range of about 1E15 to 1E19 atoms $cm^{-3}$, more conveniently in the range of about 5E15 to 5E18 atoms $cm^{-3}$, and preferably in the range of about 5E16 to 5E17 atoms $cm^{-3}$, but larger or smaller values may also be used. In one embodiment, the combination of thickness 341 and the doping density of finger regions 34(N) are such that at least some parts of finger regions 34(N) become substantially fully depleted of free carriers when the base-collector junction is reverse biased.

Region 36(P) of thickness 342 and lateral extent 364 (see FIG. 1) between lateral edges 363 is provided above finger regions 34(N) extending to surface 23 of device 20. Region 36(P) comprises central portion 361(P) overlying central portion 32(P) and peripheral portions 362(P) overlying finger regions 34(N). Region 36(P) forms the (e.g., upper) base of device 20 and desirably lies substantially laterally within outer periphery 444 of dielectric shallow trench isolation (STI) region 44. In FIGS. 1-3 and elsewhere, lateral edges 363 of region 36(P) are shown as centrally underlying STI regions 44 (which is preferred), but in other embodiments they may lie anywhere within STI regions 44. Central portion 361(P) of region 36(P) desirably has doping in the range of about 5E15 to 1E19 atoms $cm^{-3}$, more conveniently in the range of 1E16 to 5E18 atoms $cm^{-3}$, and preferably in the range of about 5E16 to 1E18 atoms $cm^{-3}$, but higher or lower values may also be used. Peripheral portions 362(P) of region 36(P) desirably have doping in the range of about 5E15 to 5E18 atoms $cm^{-3}$, more conveniently in the range of 1E16 to 1E18 atoms $cm^{-3}$, and preferably in the range of about 5E16 to 5E17 atoms $cm^{-3}$, but higher or lower values may also be used. Stated another way, it is desirable that peripheral portions 362(P) be more lightly doped than central portion 361(P) by a factor of 1 to 10, more conveniently by a factor of about 1 to 5 and preferably by a factor of about 1-2. Within regions 36(P) are centrally located contact 38(P+) of depth 381 with associated electrode 39 and (e.g., annular) shaped contacts 40(N+) of depth conveniently similar to depth 421 of regions 42(N+), and with associated electrode 41. Contact region 38(P+) serves as the base contact, contact regions 40(N+) serve as emitters and emitter contacts of device 20 and contact regions 42(N+) serves as the collector contacts. Contacts 38(P+), 40(N+) and 42(N+) are desirably heavily doped, for example in the range of about 5E19 to 5E20 atoms $cm^{-3}$, but larger or smaller values may also be used and they may be the same or different. Depths 381 and 421 are usefully in the range of about 0.05 to 0.5 micrometers, more conveniently in the range of about 0.1 to 0.4 micrometers and preferably about 0.1-0.3 micrometers, but larger or smaller values may also be used, and in other embodiments different values may be used for depths 381, 421 and the depth of contact 40(N+). Either arrangement is useful. Upper base regions or portion 362(P), central or intermediate portion 361(P), central or intermediate portion 32(P) and lower base regions 30(P) are collectively referred to as base or base region 35(P) (see FIGS. 1-2 and FIGS. 8-10).

Shallow trench isolation (STI) regions 44 are provided extending from surface 23 to depth 441. STI regions 44 are lightly hatched in FIGS. 1-3 so that they may be easily identified in both cross-sectional views (FIGS. 1-2) and plan view (FIG. 3). STI regions 44 are desirably annular shaped with annular width 442 parallel to surface 23 between inner periphery 443 and outer periphery 444, and inner width or spacing 445 (see FIG. 5). Depth 441 is usefully in the range of about 0.2 to 0.8 micrometers, more conveniently about 0.25 to 0.6 micrometers, and preferably about 0.3 to 0.5 micrometers, but larger or smaller values may also be used. Annular width 442 is usefully in the range of about 0.1 to 10 micrometers, more conveniently about 0.15 to 5 micrometers, and preferably about 0.2 to 3 micrometers, but larger or smaller values may also be used. Interior width 445 is generally selected based upon the power handling capability desired by the device designer and is within the competence of person of skill in the art.

FIG. 2 differs from FIG. 1 only in that it illustrates the electron current flow paths between emitter regions 40(N+) through base regions or portions 36(P), 32(P), 30(P) (collectively "base" region 35(P)) and collector fingers 34(N) and/or buried layer region 26(NBL) and via sinker regions 28(N) eventually to collector contact 42(N+). Regions 362(P) overlying regions 34(N) are referred to as the "upper base" or "upper portion" of base 35(P) and regions 30(P) are referred to as the "lower base" or lower portion of base 35(P). Regions 362(P) and 32(P) are coupled to each other and to base contact 38(P+) by central or intermediate portions or regions 361(P) and 32(P). Electron current paths 50, 51, 52 are illustrated. By providing appropriate relative doping and thicknesses as have been, for example previously described, electron current flow 50 can be made significantly larger than current flows 51 and 52 and thus accounts for most of the collector current. However, when a sufficiently high reverse bias is applied between collector contact 42(N+) and base contact 38(P+), parts of finger regions 34(N) along the path of electron current flow 50 can become substantially fully depleted of free carriers. This occurs because regions 34(N) are sandwiched between base regions 362(P) above and 30(P) below, which regions are coupled to each other via intermediate regions 32(P) and 361(P) and to base contact 38(P+), so as to receive the base potential. By sandwiching thin (e.g., collector) finger regions 34(N) between regions 362(P) and 30(P), substantially complete depletion of at least part of regions 34(N) is facilitated. Such depletion is believed to occur first near edges 363 from the influence of regions 362(P) above finger regions 34(N) and near edges 305 from the influence of regions 30(P) below finger regions 34(N). When such depletion occurs, the potential of finger regions 34(N) becomes clamped and, as shown later, the peak transistor current gain (BETA) becomes substantially independent of collector voltage. In addition, the peak electric field is observed to shift from near edges 363 and 305 towards PN junction interface 262 (see FIG. 2) so that breakdown eventually occurs between regions 30(P) and region 28(NBL). This takes place at higher voltages than would otherwise be obtained without the described device structure. This is highly desirable. Nearly identical breakdown voltage (BV) values are obtained for BVceo and BVcbo, which is also highly desirable. It is further found that the Early Voltage of device 20 is significantly improved compared to conventional bipolar transistors having a similar current handling capability when width 442 of STI regions 44 is sufficiently large because, after the potential of finger regions 34(N) is clamped, the Early Voltage of bipolar transistor 20 is determined by parasitic lateral NPN bipolar transistor 252 (see FIG. 2) formed by regions 40(N+), 362(P) and 28(N) as is described in more detail below. This is still further highly desirable.

Stated another way, device 20 may be thought of as comprising two merged transistors 25 (see FIG. 2). A first, substantially vertical, NPN bipolar transistor 251 is illustrated by (i) electron current paths 50 from emitters 40(N+) substantially vertically across upper base regions 362(P) to collector fingers 34(N) and then via fingers 34(N) and sinker regions 28(N) to collector contacts 42(N+), and (ii) by electron current paths 51 from emitters 40(N+) across base regions and portions 362(P), 361(P), 32(P) and perhaps some of regions 30(P) to buried layer region 26(NBL) and then via sinker regions 28(N) to collector contacts 42(N+). A second, substantially lateral bipolar transistor 252 is illustrated by electron current paths 52 from emitters 40(N+) laterally through peripheral base portions 362(P) to a collector formed by sinker regions 28(N) near edge 363 and on to collector contacts 42(N+). As depletion of finger regions 34(N) occurs, the voltage of finger regions 34(N) becomes clamped, the effective base width and peak current gain (BETA) of the vertical NPP transistor 251 become substantially independent of collector voltage, which gives rise to a high Early Voltage. Further increases in collector voltage will mostly affect only the parasitic lateral NPN transistor 252. However, by providing appropriate relative doping and thickness and a sufficiently large STI region 44, the contribution of the parasitic lateral NPN transistor to the overall collector current can be made relatively small and, as has been previously explained, the location of peak electric field is shifted towards the PN junction formed by interface 262 (see FIG. 2) where breakdown ultimately occurs. The resulting combination of properties provided by device 20 (e.g., high Early Voltage, high breakdown voltage, and high gain independent of collector voltage) are highly desirable and a significant advance in the art.

According to a still further embodiment, device 20 may be described as a transistor having emitter 40(N+), base 35(P) (comprising regions 362(P), 361(P), 32(P), 30(P)) with base contact 38(P+) and collector 37(N) (comprising regions 34(N), 26(NBL), 28(N)) with collector contact 42(N+), wherein base 35(P) comprises upper portion 362(P), lower portion 30(P) and intermediate portions (361(P) and 32(P)) that electrically couple upper 362(P) and lower 30(P) portions together and to base contact 38(P+), and wherein collector 37(N) comprises laterally extending finger regions 34(N), buried layer 26(NBL) and sinker regions 28(N) coupling finger regions 34(N) and buried layer 26(NBL) to collector contact 42(N+). Collector finger regions 34(N) extend laterally into part of base 35(P) so that upper portions 362(P) of base 35(P) lie above collector finger regions 34(N) and lower portions 30(P) of base 35(P) lie below collector finger regions 34(N), and wherein the combination of upper base portions 362(P), collector finger portions 34(N) and lower base portions 30(P) are adapted to substantially deplete collector finger regions 34(N) of mobile carriers as the base-collector junction of device 20 is reverse biased. In a preferred embodiment, buried layer 26(NBL) desirably substantially underlies base 35(P) and sinker regions 28(N) desirably substantially laterally surround base 35(P). When collector finger regions 34(N) become substantially depleted of free carriers, the voltage thereof is clamped at a voltage substantially less than the overall breakdown voltage of device 20 and the overall breakdown voltage, the Early Voltage and the gain of device 20 become decoupled and improve relative to equivalent devices without the bifurcated base and collector structures described here. The decoupling of these device parameters increases the design flexibility and desirable device properties can be more easily optimized.

While device 20 is illustrated in FIG. 3 as having a substantially annular plan view layout so that regions 30(P), 34(N), 362(P). 40(N+), 42(N+), 44, etc., have substantially closed washer-like shapes of various geometries, in other embodiments, such regions may not be closed annular shapes. For example, and not intended to be limiting, device 20 may have a plan view shape wherein such regions are stripe-like, extending linearly above and below the planes of FIGS. 1-2 (and FIGS. 4-10), wherein such stripe-like regions are terminated in planes above and below the plane of FIGS. 1-2 by one or more dielectric isolation regions or other isolation structures. Stated another way, regions 22, 26, 28, 30, 32, 34, 36, 38, 40, 42, 44 and associated regions 24, 27, 29 shown in the further cross-sectional views of FIGS. 4-10, extend behind and before the planes of FIGS. 1-2 and 4-10, until some or all therefore are terminated at planes substantially parallel to the plane of FIGS. 1-2 by dielectric isolation walls of appropriate depth or other isolation structures. Such plan view geometries are also useful and intended to be included in the exemplary embodiments.

FIGS. 4-10 are simplified cross-sectional views through device 20 of FIGS. 1-3 during various stages 104-110 of manufacture illustrating formation of intermediate structures 204-210, according to further embodiments of the invention. It should be kept in mind that even though the use of particular doping types and concentrations for the various regions (e.g., 22(P), 24, 26(NBL), 27, 28(N), 30(P), 32(P), 34(N), 36(P), 38(P+), 40(N+), 42(N+), and so forth) are described in what follows, these are presented by way of illustration and not limitation and that other doping types, concentrations and various thicknesses or dimensions may also be used. The various exemplary dimensions and doping levels referred to in connection with the discussion of FIGS. 1-3 should also be kept in mind in the discussion that follows. In addition, conventional dielectric or other protective material layers for passivation or protection of surface 23 are omitted to avoid unnecessarily cluttering the drawings. Such layers are well known in the art.

Figure 4:
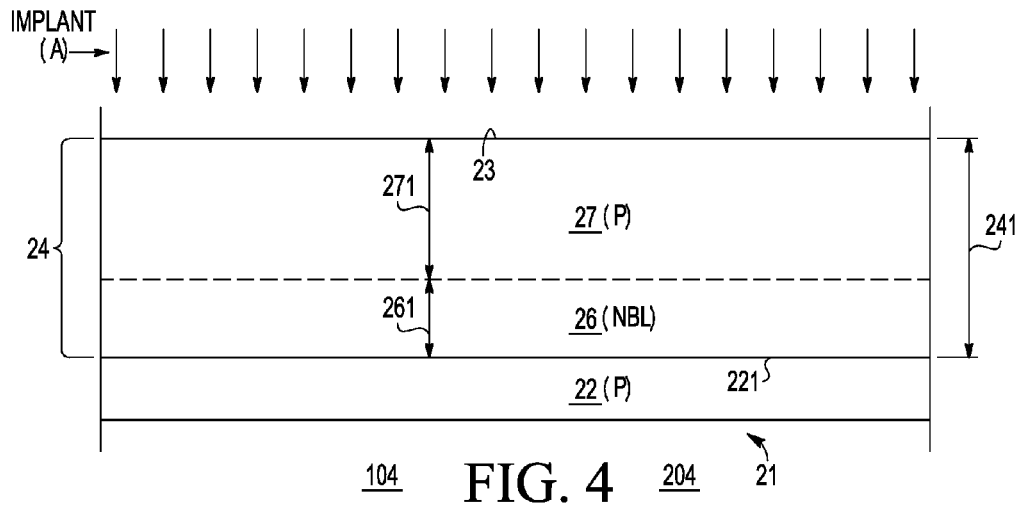
FIGS. 4-10 are simplified cross-sectional views through the device of FIGS. 1-3 during various stages of manufacture, according to further embodiments of the invention.
Figure 5:
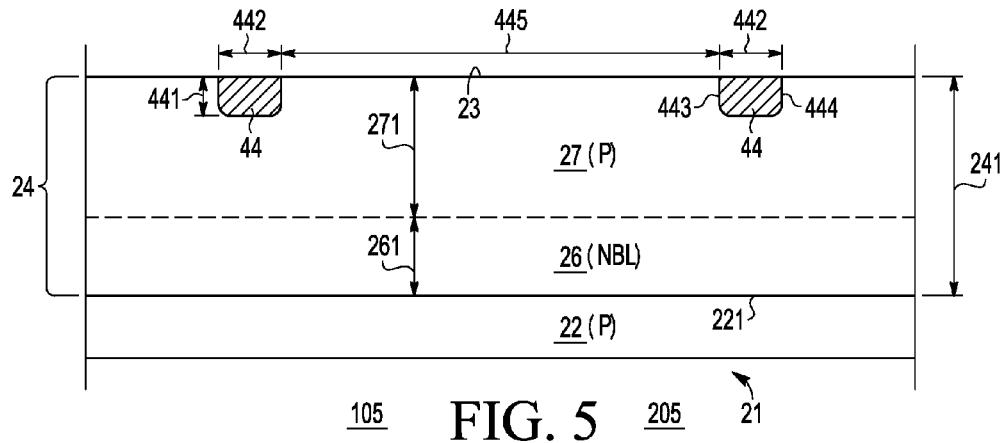

Referring now to manufacturing stage 104 of FIG. 4, SC substrate 21 is provided having substrate region 22, preferably lightly doped P type, but in other embodiments, other doping type and concentration may be used. In a preferred embodiment, Implant (A) is provided to form region 26(NBL) of approximate thickness 261 above interface 221 with substrate region 22(P) of substrate 21 and having the doping levels described in connection with FIGS. 1-2. Epi-layer 27 of thickness 271 is desirably grown above region 26(NBL) using means well known in the art. Epi-layer 27 is preferably P type with a doping level usefully in the range of about 1E14 to 1E16 atoms $cm^{-3}$, more conveniently in the range of about 5E14 to 8E15 atoms $cm^{-3}$, and preferably about 1E15 to 5E15 atoms $cm^{-3}$, but larger or smaller values may also be used. In other embodiments, region 26(NBL) may be formed as part of epi-layer 27 rather than in a separate implant step preceding formation of epi-layer 27 or in still further embodiments, region 26(NBL) may be formed after formation of epi-layer 27. In yet further embodiments, region 26(NBL) may be formed by other doping procedures than ion implantation. These and other arrangements and/or sequences are useful. The combination of region 26(NBL) and epi-layer 27 form semiconductor (SC) region 24 of thickness 241 of device 20. Structure 204 results. Referring now to manufacturing stage 105 of FIG. 5, dielectric shallow trench isolation (STI) regions 44, preferably of annular shape (see FIG. 3), of depth 441, annular width 442 between inner edges 443 and outer edges 444 and with inner dimension or width 445 between inner edges 443 are formed extending into epi-layer 27 from surface 23 using means well known in the art. Silicon oxide is a non-limiting example of a suitable dielectric for STI regions 44. Structure 205 results.

Figure 6:
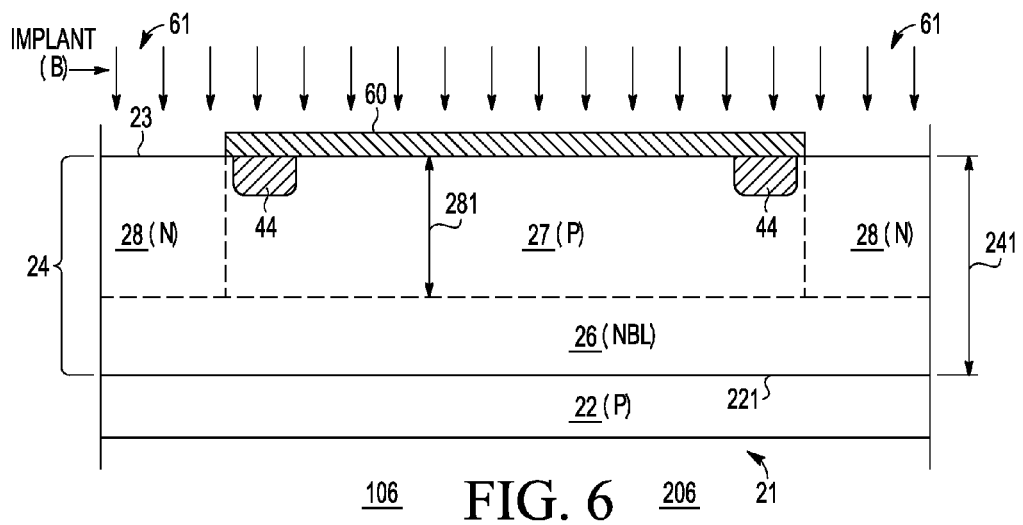

Referring now to manufacturing stage 106 of FIG. 6, mask 60 having openings 61 is formed on surface 23, and Implant (B) provided to form sinker regions 28(N) of depth 281 desirably extending to region 26(NBL) and of doping density as described in connection with FIGS. 1-2. As shown in FIG. 3, in a preferred embodiment, sinker regions 28(N) desirably have an annular plan-view shape. Mask 60 is shown as extending slightly outboard of STI regions 44, but in other embodiments, it may coincide with STI regions 44, and even extend inboard of STI regions 44. It is desirable that sinker regions 28(N) make Ohmic contact with buried layer region 26(NBL) and with subsequently formed regions 34(N), e.g., see FIGS. 1-3 and 8-10. Structure 206 results.

Figure 7:
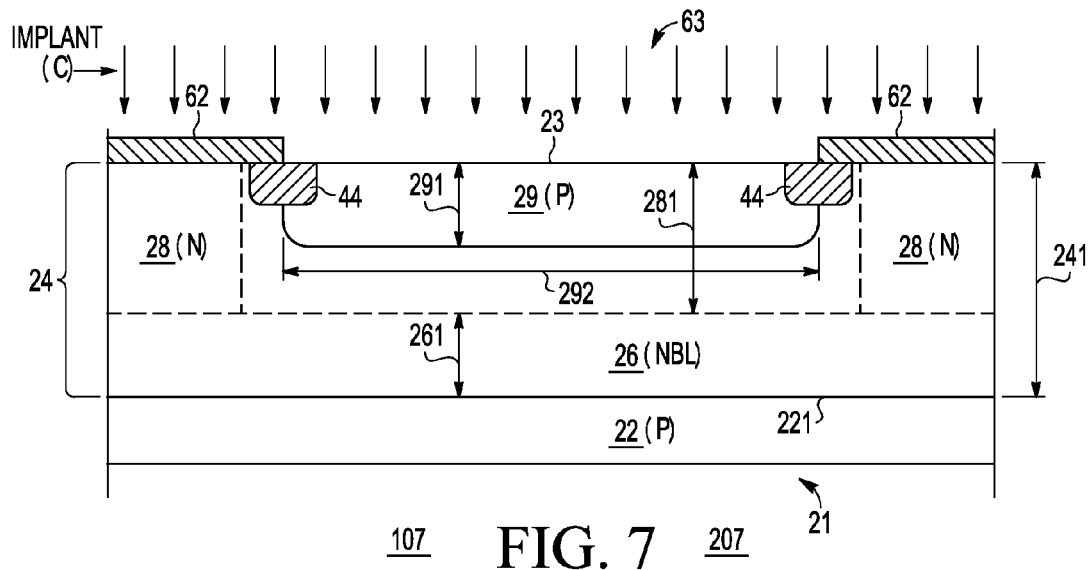

Referring now to manufacturing stage 107 of FIG. 7, mask 60 is removed and replaced with mask 62 having opening 63 on surface 23, and Implant (C) provided to form P doped region 29 of depth 291 and lateral extent 292 corresponding approximately to lateral extent 364 of subsequently formed region 36(P) (e.g., see FIGS. 1-2). Region 29 has in this embodiment a P doping level usefully in the range of about 1E14 to 1E19 atoms cm$^{-3}$, more conveniently in the range of about 5E14 to 5E18 atoms cm$^{-3}$, and preferably about 1E15 to 1E18 atoms cm$^{-3}$, but larger or smaller values may also be used. Depth 291 may extend to depth 281 or, as shown in FIG. 7, be shallower, for example, usefully about 20 to 150 percent of depth 281, more conveniently about 40 to 130 percent of depth 281 and preferably about 60-100 percent of depth 281, but larger or smaller values may also be used. Generally, it is desirable that depth 291 is larger than depth 303 of regions 30(P) beneath surface 23 that will be subsequently formed in manufacturing stage 108 of FIG. 8. Implant (C) in combination with epi-layer 27 provides the background doping into which Implant D is used in manufacturing stage 108 to form finger regions 34(N) and regions 30(P) below finger regions 34(N), and locally modify the doping of portions 362(P) of region 36(P) above finger regions 34(N). The lateral edges of opening 63 of mask 62 are shown as being approximately centered on STI regions 44, but in other embodiments, it may be off-centered or extend inboard or outboard of STI regions 44. Structure 207 results.

Figure 8:
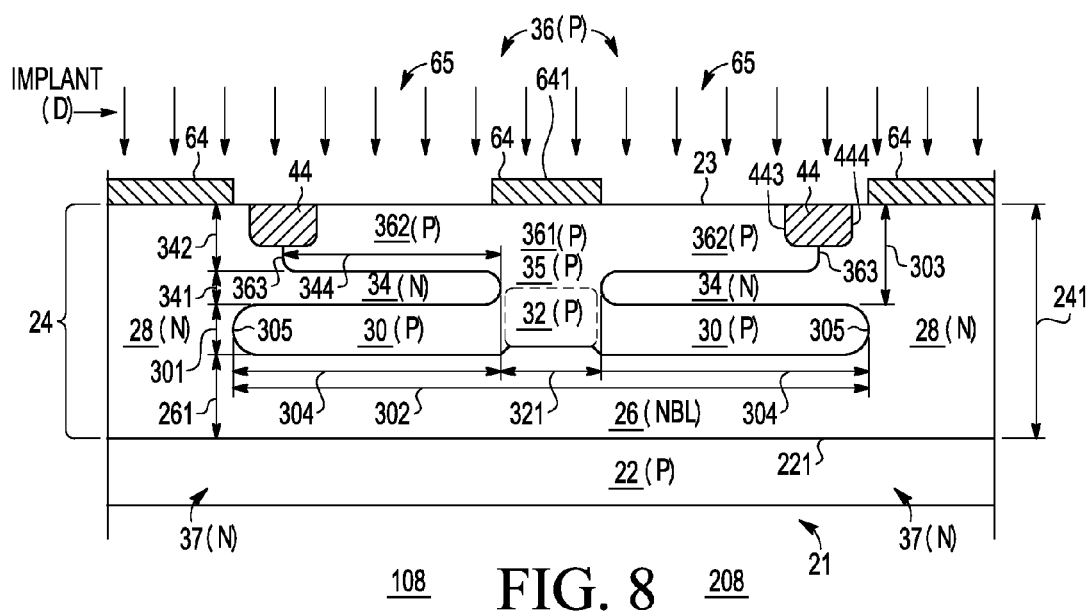

Referring now to manufacturing stage 108 of FIG. 8, mask 62 is removed and replaced with mask 64 having openings 65 on surface 23, and Implant (D) provided to form finger regions 34(N) and regions 30(P) below finger regions 34(N), and modify the doping of regions 36(P) above finger regions 34(N). Implant (D) is desirably a chain implant comprising in a preferred embodiment, Implants (D.1) and (D.2). Implant (D.1) is desirably of a first dopant, energy and dose sufficient to slightly counter-dope portions 362(P) of region 36(P) above regions 34(N) so as to have a lighter doping concentration than central portion 361(P) of region 36(P). The doping of central portion 361(P) is largely determined by combination of the doping of epi-layer 27 formed in manufacturing stage 104 of FIG. 4 and region 29 formed in manufacturing stage 107 of FIG. 7. The resulting doping densities and thicknesses are described in connection with FIGS. 1-2. Implant (D.1) also forms regions 34(N) of the depth, thickness and doping density also described in connection with FIGS. 1-2. Implant (D.1) could be a single implant or a series of N type implants. Implant (D.2) of another, e.g., P type dopant, is desirably used to form regions 30(P). The desired dopant concentration of regions 30(P) is described in connection with FIGS. 1-2. In a preferred embodiment, regions 30(P) desirably have a higher dopant concentration than the residual doping of portion 32(P) determined largely by the doping of epi-layer 27 of FIG. 4 (and in other embodiments also by the doping level of region 29 if depth 291 extends to buried layer 26(NBL)). In a preferred embodiment, it is desirable that region 30(P) be doped more heavily than region 32(P) by a factor of about 10 to 200. Boron and Phosphorous are examples of suitable dopants for Implants (D). While the described implant doping is preferred other doping arrangements may also be used. The above-described implants provide regions 362(P) above regions 34(N) and regions 30(P) below regions 34(N) and that regions 34(N) have limited thickness 341 (see FIGS. 1 and 8) so that regions 34(N) can be depleted of carriers by regions 362(P) and 30(P) when the base-collector junction of device 20 is reverse biased. This is important so that at least part of regions 34(N) along the path of electron current flow 50 (see FIG. 2) can be substantially fully depleted of carriers and significantly pinched OFF during device operation. This desirably occurs at a relatively low bias voltage. When this occurs, the potential of finger regions 34(N) is clamped and does not increase with further increases in collector voltage. Breakdown is shifted to other, substantially non-active, portions of device 20 outside of finger regions 34(N) and so that the breakdown voltage is thereby increased. Not only is better reverse breakdown voltage obtained but, as explained later, improved Early Voltage is also obtained. Portion 32(P) is protected by portion 641 of mask 64 during this implant so that its doping remains substantially as provided by Implant C of FIG. 7 in combination with epi-layer 27. The various dimensions 301, 302, 303, 304, 321, 341, 342 and 344 are discussed in connection with FIGS. 1-3. Structure 208 results.

Figure 9:
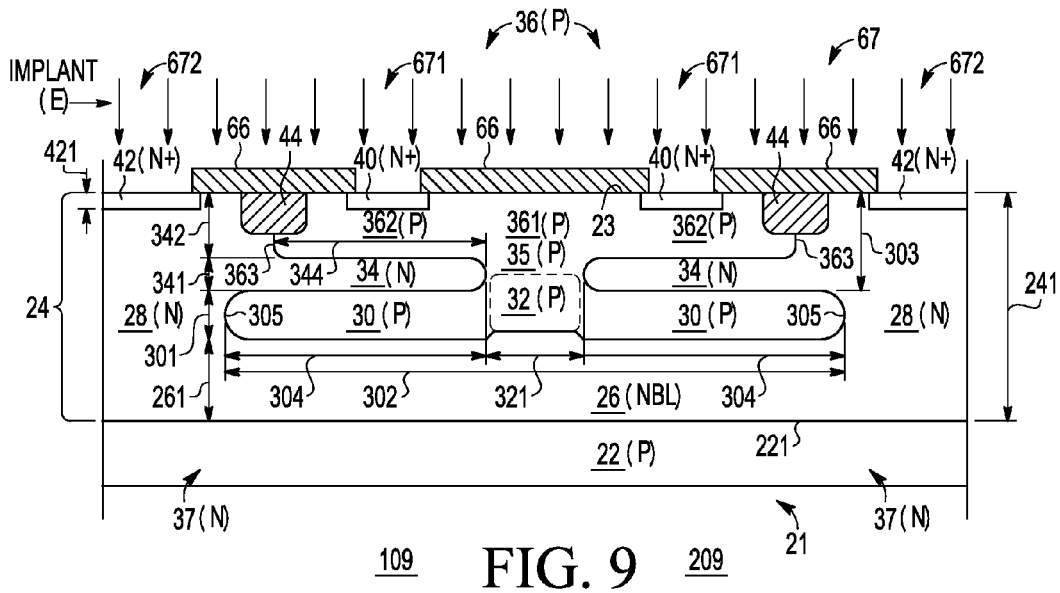
Figure 10:
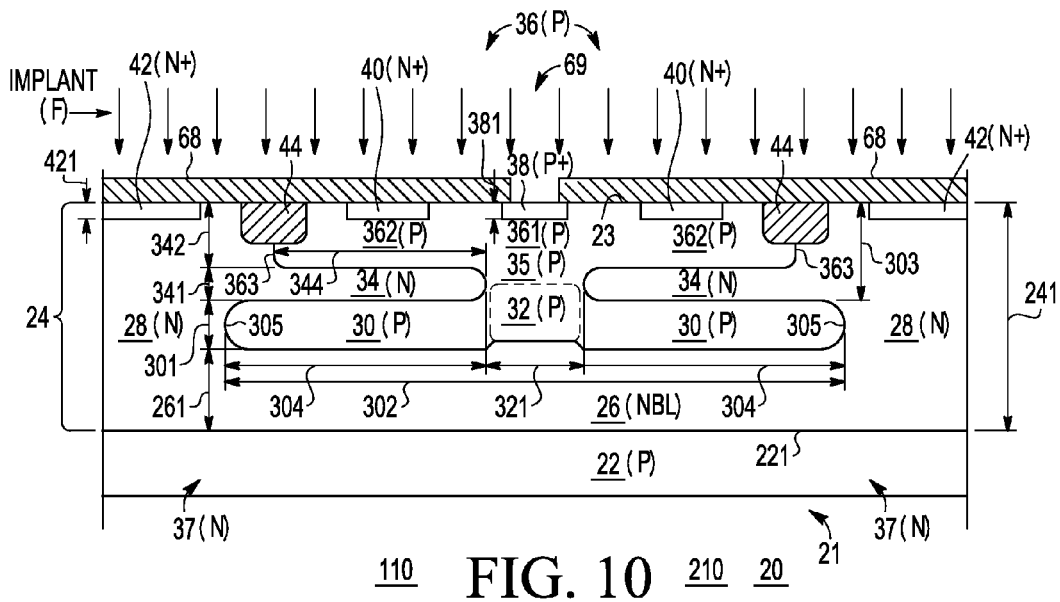

Referring now to manufacturing stage 109 of FIG. 9, mask 64 is removed and replaced with mask 66 having opening(s) 671, 672 (collectively 67) on surface 23, and Implant (E) provided to form contact regions 40(N+) and 42(N+) of doping density described in connection with FIGS. 1-2. Regions 40(N+) and 42(N+) conveniently have substantially similar depths 421 as described in connection with FIGS. 1-2, but in other embodiments they may have different depths. Either arrangement is useful. Implant (E) provides emitter regions 40(N+) and collector contact regions 42(N+). Structure 209 results. Referring now to manufacturing stage 110 of FIG. 10, mask 66 is removed and replaced with mask 68 having opening 69 on surface 23, and Implant (F) provided to form contact region 38(P+) of depth 381 from surface 23, and doping density as described in connection with FIGS. 1-2. Implant (F) provides base contact region 38(P+). Structure 210 results. Other than provision of conductive electrodes 39, 41, 43 (see FIG. 1; not shown in FIG. 10) and whatever other interconnections, passivation layers and interlayer dielectrics may be needed to passivate device 20 and couple device 20 to other devices forming an integrated circuit (IC) of which device 20 may be a part, device 20 is substantially finished. Forming such electrodes, interconnections and dielectric layers are well known in the art. While manufacturing stages 104-110 have been described in the order shown, this is merely for convenience of explanation and not intended to be limiting. Once substrate 21 of manufacturing stage 104 of FIG. 4 has been provided, then remaining manufacturing stages 105-110 may be provided in any order and, as has already been explained, in manufacturing stage 104, layer 26(NBL) may be provided before, during or after formation of epi-layer 27.

Figure 11:
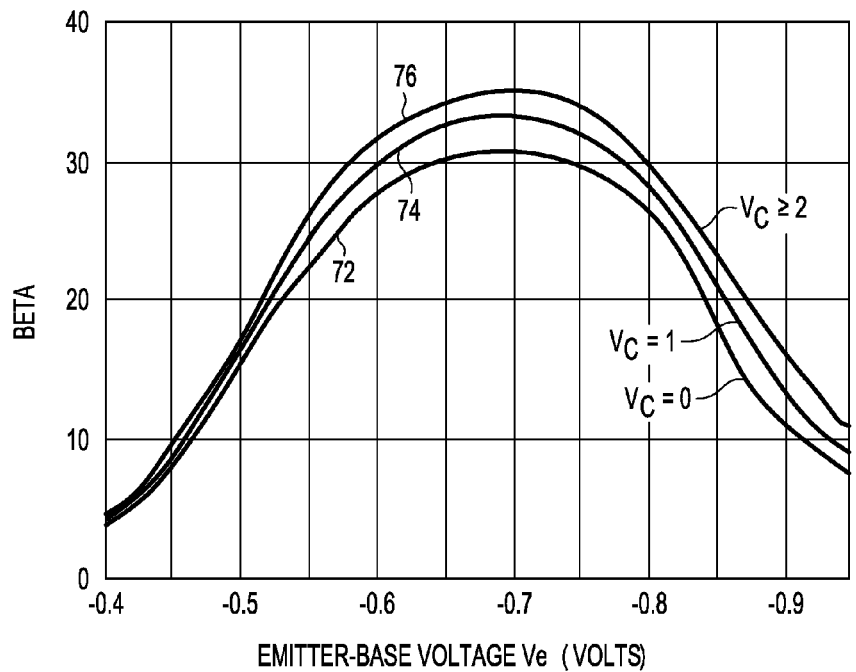
FIG. 11 is a plot of current gain (BETA) versus emitter voltage at different collector voltages, for the device of FIGS. 1-3.

FIG. 11 shows plot 70 of current gain (BETA) obtained by analytical simulation versus emitter-base voltage Ve at different collector voltages Vc, for the device of FIGS. 1-3. Emitter voltage Ve and collector voltage Vc are measured with respect to the base as the common terminal. Current gain BETA is defined as the ratio of the collector current divided by the base current. Trace 72 shows a plot of BETA versus Ve at substantially zero collector voltage, V~0. Trace 74 shows a plot of BETA versus Ve at Vc~1 volt and trace 76 shows a plot of BETA verses Ve at Vc≥2.2-2.3 volts, that is, for Vc greater than or equal to about 2.2-2.3 volts. As noted earlier, depletion and pinch-off of part of finger regions 34(N) along the path of electron current flow 50 causes the voltage associated with finger regions 34(N) to become fixed at about 2.2-2.3V in such embodiments. When this occurs, the electric field across the collector-base junction formed between regions 362(P) and 34(N) remains relatively constant and does not increase with higher collector voltages. Consequently, the current gain (BETA) also remains relatively unchanged. When the collector voltage increases further, the peak electric field shifts from near edges 363 and 305 toward interface 262 (see FIG. 2) between regions 30(P) and 26(NBL) where breakdown eventually occurs. Not only is the breakdown voltage higher than has been obtained with otherwise equivalent devices, but the maximal gain is also higher. For example, BETA is observed to increase from about 18 with equivalent prior art devices to about 35, as can be noted from FIG. 11. This is believed to result from the reduction in doping of portions 362(P) of base regions 36(P) above finger regions 34(N) relative to the doping of central region 361(P). The Early Voltage is also improved, going from about 150 to about 200-800 volts or higher. The Early Voltage can also be tuned to meet specific application requirements by suitably selecting width 442 of STI regions 44. This is explained in more detail in connection with FIGS. 12-13 in the following.

Figure 12:
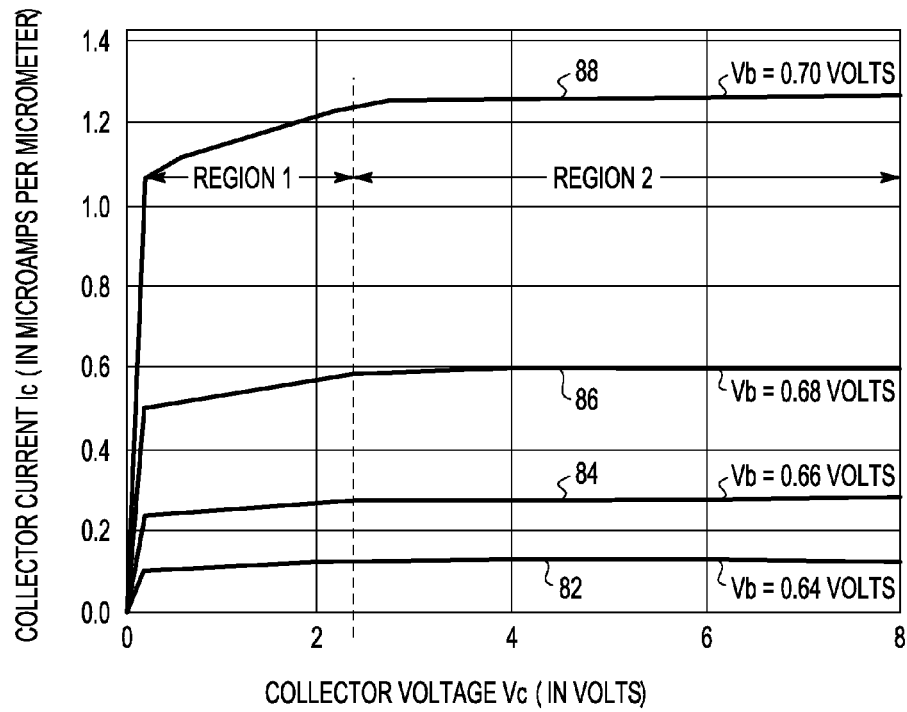
FIG. 12 is a plot of collector current (in microamps per micrometer) versus collector voltage (in volts) for different values of base voltage for the device of FIGS. 1-3.

FIG. 12 shows plot 80 of collector current Ic (in microamps per micrometer) obtained by analytical simulation versus collector voltage Vc (in volts) for different values of base voltage Vb for the device of FIGS. 1-3. Collector voltage Vc and base voltage Vb are measured with respect to the emitter as the common terminal. Trace 82 shows Ic versus Vc for Vb=0.64 volts. Trace 84 shows Ic versus Vc for Vb=0.66 volts. Trace 86 shows Ic versus Vc for Vb=0.68 volts. Trace 88 shows the Ic versus Vc for Vb=0.70 volts. Plot 80 can be roughly divided into two regions: Region 1 corresponds to a low Vc region from Vc~zero to about Vc~2.2-2.3 volts, and region 2 corresponds to higher Vc regions for Vc of about Vc≥2.2-2.3 volts. The Early Voltage is defined as the voltage at which a line extended parallel to the slope of an Ic versus Vc trace in the forward active regions intersects the horizontal axis. The Early Voltage is inversely proportional to the slope of the Ic versus Vc trace in the forward active regions. Accordingly, as the Ic versus Vc trace flattens (becomes more horizontal) the Early Voltage increases. It will be noted that in Region 1, the Ic verses Vc traces have a significant upward tilt up to about Vc~2.2-2.3 volts, and therefore correspondingly lower Early Voltages in this Vc range. In Region 2 above about Vc~2.2-2.3 volts, the Ic versus Vc traces are very nearly horizontal and the Early Voltage is much higher than in Region 1. The Early Voltage is low in Region 1 since it is determined by the base width modulation in vertical NPN bipolar transistor 251 corresponding to electron current paths 50, 51. The Early Voltage is substantially improved in Region 2. As the collector voltage Vc rises above about Vc~2.2-2.3 volts, part of the narrow collector finger regions 34(N) near edges 363 and 305 along electron current path 50 (see FIG. 2) become fully depleted from the top by portions 362(P) of upper base region 36(P) above collector finger regions 34(N) and from the bottom by lower base regions 30(P) below collector finger regions 34(N). The potential of collector finger regions 34(N) becomes clamped at this transition voltage, i.e., about Vc~2.2-2.3 volts. Therefore, the Early Voltage in the vertical bipolar transistor 251 formed by regions 40(N+), 362(P), and 34(N) is significantly improved. In the mean time, region 32(P) is depleted from the bottom by region 26(NBL) and from the right and left by regions 34(N). By providing appropriate relative doping and thickness such as have been described herein, region 32(P) can be substantially depleted almost entirely when pinch-off of region 34(N) occurs. By virtue of charge sharing in region 32(P) and heavier doping in region 361(P), further increases in collector voltage will not substantially extend the depletion from region 32(P) into region 361(P). Thus, base width modulation along electron current path 51, which travels through a relatively larger base region comprising of 362(P), 361(P) and 32(P), is significantly reduced after pinch-off of regions 34(N) take place, which effectively improves the Early Voltage in this vertical bipolar transistor and, as shown in FIG. 11, the peak beta becomes nearly independent of the collector voltage thereafter. Under these circumstances, the current gain and the Early Voltage are decoupled.

Figure 13:
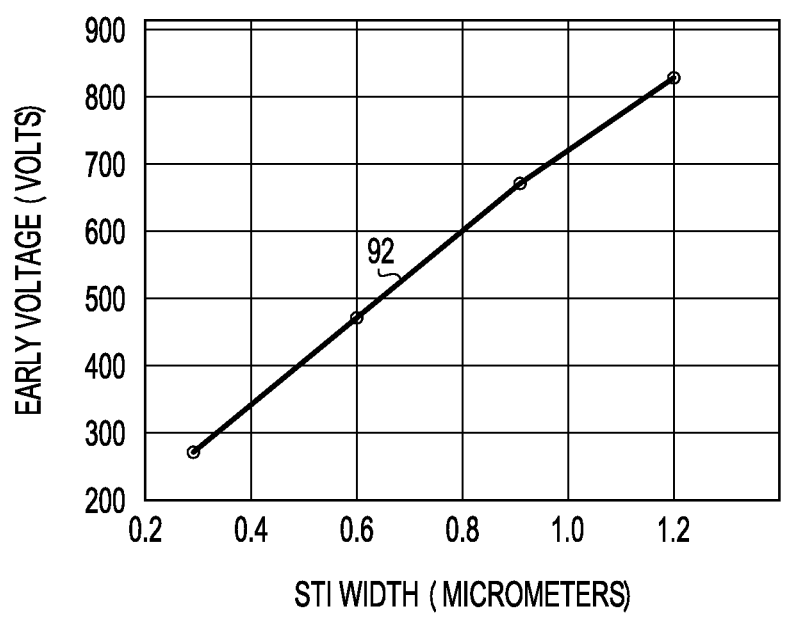
FIG. 13 is a plot of the Early Voltage versus shallow trench isolation (STI) width for the devices of FIGS. 1-3.

After regions 34(N) are pinched off, the Early Voltage of the bipolar transistor is largely determined by parasitic lateral bipolar 252 illustrated by electron current path 52. FIG. 13 shows plot 90 of the Early Voltage obtained by analytical simulation versus width 442 (see FIG. 1) of shallow trench isolation (STI) regions 44 for the devices of FIGS. 1-3. The Early Voltages were extracted from Ic-Vc curves with a base voltage of 0.6 V. It will be apparent from trace 92 of plot 90, that the Early Voltage can be substantially increased by adjusting width 442 of STI regions 44. The current gain (BETA) does not degrade as the Early Voltage increases, indicating that they are decoupled. These are significant advantages.

After pinch-off of collector regions 34(N), the highest electric field occurs at the interface between region 30(P) and 26(NBL) where breakdown ultimately occurs. In effect, breakdown occurs outside the principal active bipolar transistor area corresponding to primary paths 50, 51, 52. Thus, breakdown voltages are substantially decoupled from current gain and Early Voltage. As noted earlier, BVcbo and BVceo are nearly identical. Thus, the embodiments described herein provide a way by which the current gain, Early Voltage and breakdown voltage can be substantially decoupled. This provides greater flexibility in optimizing device properties to suit particular design goals and is a significant advance in the art.

In the embodiments described below, the illustrative N and P doping types previously included by way of example following the reference numbers of the various regions of device 20 are omitted. This is intended to serve as a reminder that either N or P type regions may be used depending upon whether the devices are intended to function as NPN or PNP transistors, that is, those regions identified as preferably N type in the preceding description may be either N or P type and those regions identified as preferably P type in the preceding description are therefore either P or N type.

According to a first embodiment, there is provided a bipolar transistor (20), comprising, an emitter region (40), a base region (35) comprising upper portions (362), lower portions (30), and intermediate portions (361, 32) Ohmically coupling the upper (362) and lower (30) portions, and a collector region (37) comprising finger regions (34) laterally extending into part of the base region (35) so that the upper portions (362) of the base region (35) lie above the finger regions (34) and the lower portions (30) of base region (35) lie below the finger regions (34). In a further embodiment, the combination of the upper portions (362), the finger regions (34) and the lower portions (30) are adapted to significantly deplete the finger regions (34) of mobile carriers as a base-collector junction of the device (20) is reverse biased. In a still further embodiment, the transistor further comprises a buried layer (26) substantially underlying the base region (35). In a yet further embodiment, the transistor further comprises sinker regions (28) coupled to the finger regions (34) and lying substantially laterally outboard of the base region (35). In a still yet further embodiment, the finger regions (34) have a substantially annular shape in plan view with an outer periphery (363, 305) and an inner periphery (345). In a yet still further embodiment, the outer periphery (363, 305) and inner periphery (345) have a substantially rectangular plan view shapes. In another embodiment, at least one of the outer periphery (363, 305) and inner periphery (345) has other than a substantially rectangular plan view shape. In a still another embodiment, the intermediate portions (361, 32) are substantially aligned with the inner periphery (345). In a yet another embodiment, the intermediate portions (361, 32) are substantially centrally located with respect to the finger regions (34). In a still yet another embodiment, the finger regions (34) have a spoke-like plan view shape.

According to a second embodiment, there is provided a bipolar device (20), comprising, a first region (40) of a first conductivity type, a second region (37) of the first conductivity type spaced apart from the first region, and a third region (35) of a second, opposite, conductivity type between the first (40) and second (37) regions, wherein a first portion (34) of the second region (37) extends laterally into and is surrounded on three sides by at least part the third region (35). According to a further embodiment, a first part (362) of the third region (35) overlies the first portion (34) of the second region (37) and a second part (30) of the third region (35) underlies the first portion (34) of the second region (37). According to a still further embodiment, the combination of the first part (362) of the third region (35), the first portion (34) of the second region (37) and the second part (30) of the third region (35) are adapted to significantly deplete the first portion (34) of the second region (37) of mobile carriers as a base-collector junction of the device (20) is reverse biased. According to a yet further embodiment, the first portion (34) of the second region (37) has therein a centrally located space (321) into which a third part (32) of the third region (35) extends. According to a still yet further embodiment, a second portion (28) of the second region (37) is electrically coupled to the first portion (34) of the second region (37) and lies substantially laterally outboard of the third region (35).

According to a third embodiment, there is provided a method for forming a bipolar transistor, comprising, providing a substrate (22), forming a first semiconductor region (27, 35) of a first conductivity type on the substrate (22) having a first surface (23) spaced apart from the substrate (22), providing first and second dielectric isolation regions (44) in the first semiconductor region (27, 35) extending to the first surface (23), doping first portions (28) of the first semiconductor region (27) lying at least partially laterally outboard of the first and second dielectric isolation regions (44) so that the first portions (28) have a second, opposite, conductivity type, and doping second portions (34) of the first semiconductor region (27,35), so that the second portions (34) have the second, opposite, conductivity type and are spaced apart from the first surface (23) and extend laterally inward from the first portions (28) a first distance (304, 344) at a third depth (342) from the first surface (23) wherein first parts (362) of the first semiconductor region (27, 35) overlie the second portions (34) and second parts (30) of the first semiconductor region (27, 35) underlie the second portions (34). According to a further embodiment, the method further comprises forming in the first part (362) of the first semiconductor region (27, 35) further doped regions (40) of the second, opposite conductivity type extending from the first surface (23) and spaced apart from the second portions (34). According to a still further embodiment, the method further comprises providing a third part (361, 32) of the first semiconductor region (27, 35) of the first conductivity type and Ohmically coupling the first (362) and second (30) parts of the first semiconductor region (27, 35). According to a yet further embodiment, the first and second dielectric isolation regions (44) are part of a substantially annular shaped dielectric isolation region (44). According to a still yet further embodiment, the first and second dielectric isolation regions (44) have an overall lateral extent and the further doped regions (40) lie laterally substantially within the overall lateral extent.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A bipolar transistor, comprising:
    an emitter region at a surface of the bipolar transistor;
    a base region comprising upper portions surrounding the emitter region, lower portions, and intermediate portions Ohmically coupling the upper and lower portions, wherein the upper portions, the lower portions, and the intermediate portions form a continuous region of a first conductivity type;
    a base contact of the first conductivity type at the surface of the bipolar transistor and positioned within the base region above the intermediate portions; and
    a collector region of a second, opposite, conductivity type comprising finger regions laterally extending into part of the base region so that the upper portions of the base region lie above the finger regions and the lower portions of base region lie below the finger regions, wherein the finger regions underlie an entirety of the emitter region.

2. The device of claim 1, wherein the combination of the upper portions, the finger regions and the lower portions are adapted to significantly deplete the finger regions of mobile carriers as a base-collector junction of the device is reverse biased.

3. The device of claim 1, further comprising a buried layer substantially underlying the base region.

4. The device of claim 1, further comprising sinker regions coupled to the finger regions and lying substantially laterally outboard of the base region.

5. The device of claim 1, wherein the finger regions have a substantially annular shape in plan view with an outer periphery and an inner periphery.

6. The device of claim 5, wherein the outer periphery and inner periphery have a substantially rectangular plan view shapes.

7. The device of claim 5, wherein at least one of the outer periphery and inner periphery has other than a substantially rectangular plan view shape.

8. The device of claim 5, wherein the intermediate portions are substantially aligned with the inner periphery.

9. The device of claim 1, wherein the intermediate portions are substantially centrally located with respect to the finger regions.

10. The device of claim 1, wherein the finger regions have a spoke-like plan view shape.

11. The bipolar transistor of claim 1, further comprising:
an emitter contact coupled to the emitter region on a surface of the bipolar transistor, wherein the emitter contact and the base contact are separate from each other at the surface.

12. A bipolar device, comprising:
a first region of a first conductivity type extending to a surface of the bipolar device;
a second region of the first conductivity type spaced apart from and underlying an entirety of the first region;
a third region of a second, opposite, conductivity type having a first part between the first and second regions and surrounding the first region, a second part below a first portion of the second region, a first central portion between the first and second parts, and a second central portion positioned above the first central portion and extending to the surface of the bipolar device from the first central portion, wherein the first part, the second part, the first central portion, and the second central portion are continuously coupled, and wherein the first portion of the second region extends laterally into and is surrounded on three sides by at least part of the third region; and
a contact region of the second, opposite, conductivity type at the surface of the bipolar transistor and positioned within the second central portion of the third region.

13. The device of claim 12, wherein the first part of the third region overlies the first portion of the second region and the second part of the third region underlies the first portion of the second region.

14. The device of claim 13, wherein the combination of the first part of the third region, the first portion of the second region and the second part of the third region are adapted to significantly deplete the first portion of the second region of mobile carriers as a base-collector junction of the device is reverse biased.

15. The device of claim 13, wherein the first portion of the second region has therein a centrally located space into which the first central portion of the third region extends.

16. The device of claim 15, wherein a second portion of the second region is electrically coupled to the first portion of the second region and lies substantially laterally outboard of the third region.

17. A bipolar transistor comprising:
a substrate;
a continuous first semiconductor region of a first conductivity type in the substrate having a first parts at a surface of the substrate, second parts spaced apart from and underlying the first parts at a first depth from the surface, and a central portion connecting the first and second parts;
a contact region of the first conductivity type at the surface of the substrate and positioned within the first semiconductor region above the central portion of the first semiconductor region;
first and second dielectric isolation regions in the first semiconductor region extending to the surface;
first portions of a second semiconductor region lying at least partially laterally outboard of the first and second dielectric isolation regions, wherein the first portions are doped to have a second, opposite conductivity type;
second portions of the second semiconductor region, wherein the second portions are doped to have the second, opposite, conductivity type and are spaced apart from the surface and extend laterally inward from the first portions a first distance at a second depth from the surface that is less than the first depth, wherein the first parts of the first semiconductor region overlie the second portions, and the second parts of the first semiconductor region underlie the second portions; and
further doped regions of the second, opposite conductivity type in the first part of the first semiconductor region, wherein the further doped regions extend from the first surface and are spaced apart from the second portions, and wherein the second portions underlie an entirety of the further doped regions.

18. The bipolar transistor of claim 17, wherein the first and second dielectric isolation regions have an overall lateral extent, and the further doped regions lie laterally substantially within the overall lateral extent.

19. The bipolar transistor of claim 17, wherein the first and second parts of the first semiconductor region are Ohmically coupled.

20. The bipolar transistor of claim 17, wherein the first and second dielectric isolation regions are part of a substantially annular shaped dielectric isolation region.

* * * * *